United States Patent
Miyase et al.

(10) Patent No.: US 6,452,219 B1
(45) Date of Patent: *Sep. 17, 2002

(54) INSULATED GATE BIPOLAR TRANSISTOR AND METHOD OF FABRICATING THE SAME

(75) Inventors: Yoshiyuki Miyase, Okazaki; Naohito Kato, Kariya; Haruo Kawakita, Okazaki; Naoto Okabe, Chita-gun, all of (JP)

(73) Assignee: Denso Corporation, Kariya (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/917,488

(22) Filed: Aug. 26, 1997

(30) Foreign Application Priority Data

Sep. 11, 1996 (JP) .............................. 8-240559

(51) Int. Cl.[7] .............................. H01L 29/74
(52) U.S. Cl. ............ 257/139; 257/142; 257/168; 257/172; 257/342; 257/399; 257/913
(58) Field of Search .................. 257/139, 263, 257/142–145, 328–329, 335–342, 372, 376, 401; 438/268–274

(56) References Cited

U.S. PATENT DOCUMENTS

| | | | | |
|---|---|---|---|---|
| 4,928,155 | A | * 5/1990 | Nakagawa et al. | 357/23.4 |
| 4,985,741 | A | 1/1991 | Bauer et al. | |
| 4,989,058 | A | * 1/1991 | Colak et al. | 357/23.8 |
| 5,519,245 | A | 5/1996 | Tokura et al. | |
| 5,723,882 | A | * 3/1998 | Okabe et al. | 257/139 |
| 5,753,943 | A | * 5/1998 | Okabe et al. | 257/139 |
| 5,994,189 | A | * 11/1999 | Akiyama | 438/268 |

FOREIGN PATENT DOCUMENTS

| | | | | |
|---|---|---|---|---|
| DE | 004104588 | * | 8/1991 | 257/139 |
| EP | 0503605 | | 9/1992 | |
| EP | 000522670 | * | 1/1993 | 257/139 |
| EP | 0622853 | | 11/1994 | |
| JP | 64-54765 | | 3/1989 | |
| JP | 64-81270 | | 3/1989 | |
| JP | 64-82565 | | 3/1989 | |
| JP | 64-82566 | | 3/1989 | |
| JP | 64-90561 | | 4/1989 | |
| JP | 1-282872 | | 11/1989 | |
| JP | 402036561 | * | 2/1990 | 257/139 |
| JP | 2-112285 | | 4/1990 | |
| JP | 404192366 | * | 7/1992 | 257/139 |
| JP | 4-66110 | | 10/1992 | |
| JP | 5-78949 | | 10/1993 | |
| JP | 5-275688 | | 10/1993 | |
| JP | 6-80831 | | 10/1994 | |
| JP | 7-226514 | | 8/1995 | |

* cited by examiner

Primary Examiner—Steven Loke
Assistant Examiner—Ori Nadav
(74) Attorney, Agent, or Firm—Harness, Dickey & Pierce, PLC

(57) ABSTRACT

An IGBT having a buffer layer for shortening the turn-off time and for preventing the latching up is improved. The buffer layer of the present invention is not bare at the edge of a diced cross-section of the IGBT chip. According to this construction, a withstanding voltage between a semiconductor substrate and the buffer layer is lower than the withstand voltage of the pn junction at the edge of the diced cross-section. Therefore, the whole pn junction between the semiconductor substrate and the buffer layer, which has wide area, breaks down, as a result, energy caused by a negative voltage is absorbed, and the withstanding voltage against the negative voltage is improved.

34 Claims, 4 Drawing Sheets

иНSULATED GATE BIPOLAR TRANSISTOR
AND METHOD OF FABRICATING THE
SAME

CROSS REFERENCE TO RELATED
APPLICATION

This application is based on and claims priority of Japanese Patent Application No. Hei. 8-240559 filed on Sep. 11, 1996, the content of which is incorporated herein by reference.

BACKGROUND OF THE INVENTION

1. Field of the Invention

The present invention relates to an insulated gate bipolar transistor (IGBT).

2. Description of Related Art

FIG. 5 shows a portion of a conventional IGBT. As shown in FIG. 5, an n⁻ type layer 2 is disposed above a p type semiconductor substrate 1, and p type base areas 3 are partly formed in the n⁻ type layer 2 to form a plurality of IGBT unit cells at the face of the n⁻ type layer. At the face of the p type base area 3 of each unit cell is formed an n⁺ type source area 4 and thereby a channel area is defined at the face of the p type base area 3 between the n⁻ type layer 2 and the n⁺ type source area 4 in each unit cell. A common gate electrode 6 is disposed for the IGBT unit cells to overlap with the respective channel areas. The common gate electrode 6 is covered with interlayer insulation film 7.

A common source electrode 8 contacts both the base area 3 and the source area 4 in each unit cell, and a common drain electrode 9 which supplies a drain current is disposed on a back side of the semiconductor substrate 1. A n⁺ type buffer layer 10 is disposed between the semiconductor substrate 1 and the n⁻ type layer 2; this buffer layer 10 is for shortening the turn-on time of the IGBT 100 and for preventing a latch up from occurring by interrupting injections of holes from the semiconductor substrate 1 to the n⁻ type layer 2.

FIGS. 6A and 6B show an operation of a circuit using the IGBT 100 as a switch for actuating a load disposed in a vehicle.

As shown in FIG. 6A, the IGBT 100 is connected in series to a load 101, for instance an ignition coil, and actuates the load 101 when power is supplied thereto from a battery 102 via an ignition switch 103. An inductive load 104 is connected to a power line extending from the battery 102 in parallel to the IGBT 100 and the load 101.

As shown in FIG. 6B, when the ignition switch 103 is turned off, a negative voltage resulting from a reverse voltage of inductive load 104 may be induced on the power line, and a noise voltage whose magnitude is between −100V and −200V may be applied to the drain electrode 9 of the IGBT 100. A withstanding voltage in the IGBT 100 against a positive voltage depends on a pn junction formed between the n⁻ type layer 2 and the p type base area. A withstanding voltage in the IGBT 100 against a negative voltage depends on a pn junction formed between the semiconductor substrate 1 and the buffer layer 10.

Conventionally, the n⁺ type buffer layer 10 is formed entirely on a wafer and the IGBT 100 is always constructed as a semiconductor chip by dicing the semiconductor wafer as shown in FIG. 5. Accordingly, the buffer layer 100 is bare at the edge of a cross-section formed by dicing of the semiconductor wafer. Crystallinity at the edge of the cross-section is rough because of dicing, and the pn junction at the edge of the cross-section includes crystal defects and is unstable. Therefore, the withstanding voltage of the pn junction at the edge of the cross-section is drastically decreased, and when the negative voltage is applied to the IGBT 100, breakdown occurs at a portion where the withstanding voltage of the pn junction is lowest on the edge of the cross-section (i.e., a portion surrounded by a broken line in FIG. 5). Thus, energy caused by the negative voltage localizes at the edge portion, and the IGBT 100 may be destroyed by heat resulting from voltage localization.

SUMMARY OF THE INVENTION

In view of the above problems of the related art, an object of the present invention is to prevent an IGBT from breaking down at an edge portion when a negative voltage is applied to the IGBT, and to improve a withstanding voltage against a negative voltage.

In order to accomplish the above-described object, according to the present invention, a buffer layer made of a second conductivity type semiconductor is located between a first layer and a second layer not to bare an edge of a diced cross-section of a chip. In general, the higher the impurity concentration, the lower the withstand voltage because a withstand voltage of a pn junction is determined by impurity concentration at the pn junction; when the buffer layer is not bare at the edge of the diced cross-section as described in the present invention, the withstand voltage of the pn junction between a semiconductor substrate and the buffer layer can be lower than the withstand voltage of the pn junction at the edge of a diced cross-section even if the pn junction at the edge of the diced cross-section includes crystal defects due to the dicing.

Therefore, the whole pn junction between the semiconductor substrate and the buffer layer, which has a wide area, breaks down; as a result, energy caused by a negative voltage is absorbed, and the withstanding voltage against the negative voltage is improved.

Preferably, the buffer layer is formed as a mesh shape or an island shape.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE
PREFERRED EMBODIMENTS

Preferred embodiments of the present invention are described hereinafter with reference to the accompanying drawings.

(First Embodiment)

Figure 1:
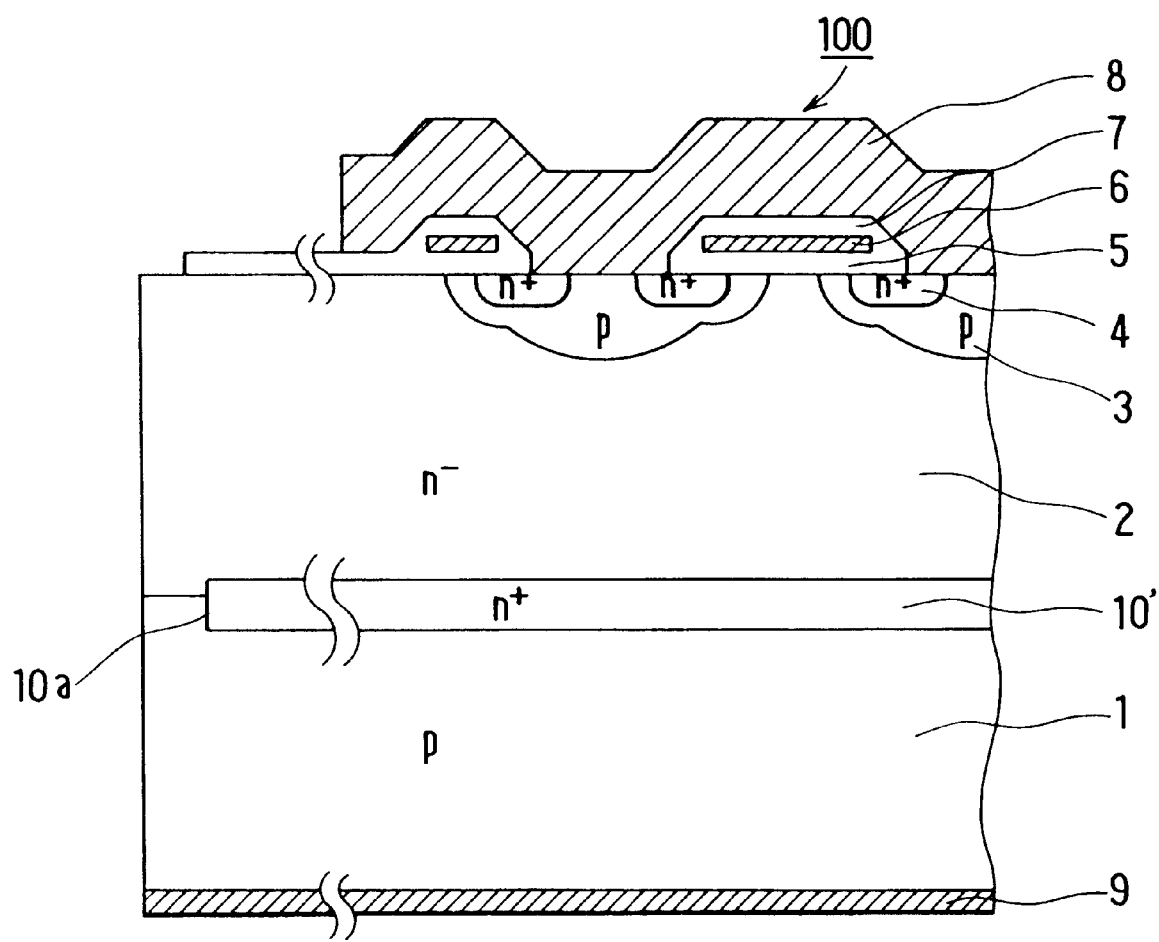
FIG. 1 is a cross-sectional view illustrating a portion of chip an IGBT according to a first preferred embodiment of the present invention.
Figure 5:
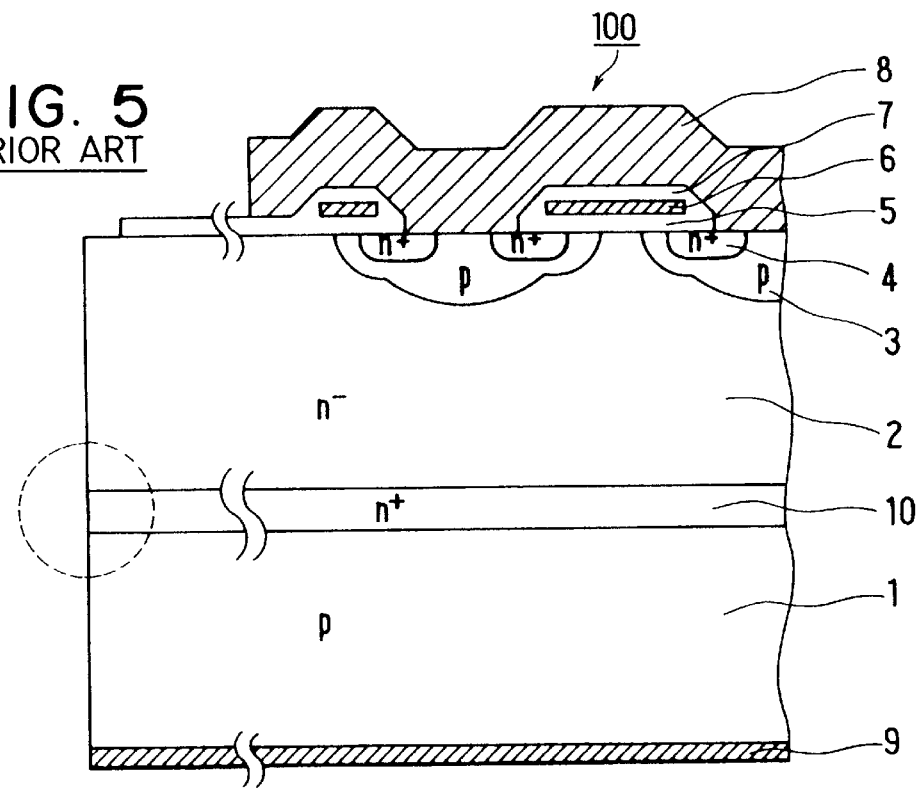
FIG. 5 is a cross-sectional view illustrating a conventional IGBT according to a related art.
Figure 6A:
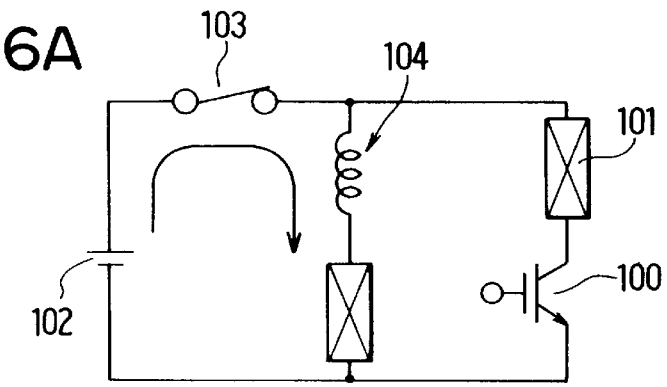
FIGS. 6A and 6B are circuit diagrams showing an operation of the IGBT as a switch for actuating a load disposed in a vehicle.
Figure 6B:
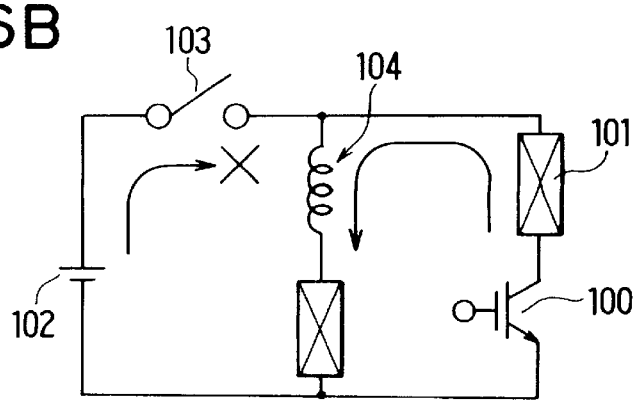

FIG. 1 shows a cross-sectional view illustrating an IGBT according to a first preferred embodiment of the present invention. Basic construction of the IGBT 100 in this embodiment is the same as in the related art shown in FIG. 5 (the same parts illustrated in FIG. 1 are denoted by the same signs illustrated in FIG. 5). However, this embodiment is different from the related art shown in FIG. 5 in that a buffer layer is not bare at the edge of a cross-section. As shown in FIG. 1, a semiconductor substrate 1 contacts an n type layer 2, thus forming a pn junction at the edge of the cross-section, the edge 10a of the buffer layer 10' being located a predetermined distance inside of the edge of the cross-section. In this case, the predetermined distance means a distance such that the edge 10a of the buffer layer 10' is not influenced by defects resulting from dicing.

Figure 2A:
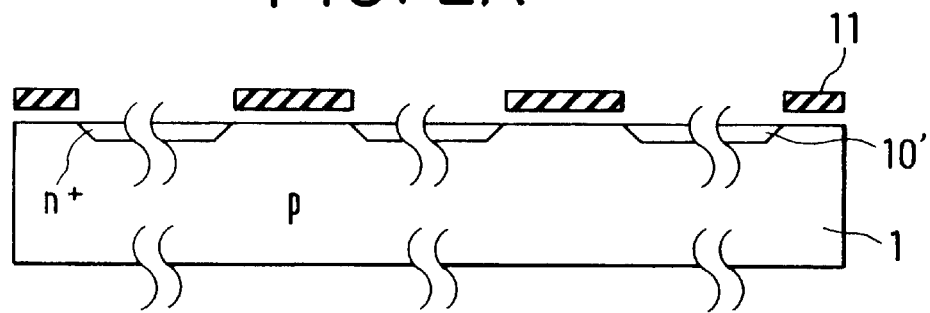
FIGS. 2A–2C are cross-sectional views showing processes of fabricating the IGBT chip illustrated in FIG. 1.
Figure 2B:
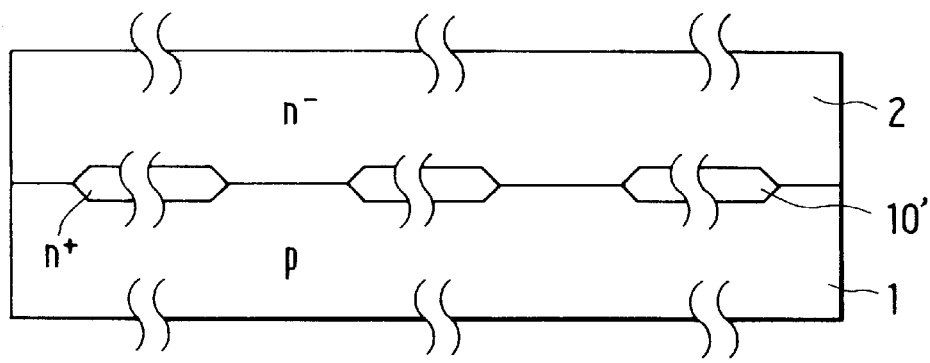
Figure 2C:
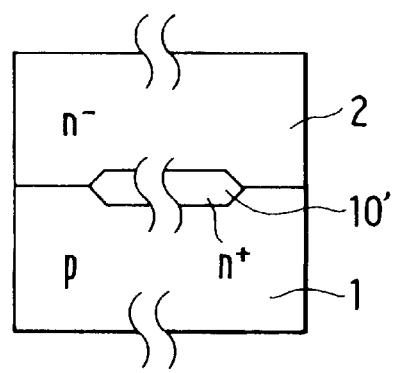

A method of fabricating the IGBT chip 100 shown in FIG. 1 is described based on FIGS. 2A–2C. In FIGS. 2A–2C, base areas 3, source areas 4, a gate insulating film 5, a gate electrode 6, an interlayer insulation film 7, a source electrode 8 and a drain electrode 9 (all shown in FIG. 1) are not shown. First, as shown in FIG. 2A, a p type semiconductor wafer having an impurity concentration of $3\times10^{18}$ cm$^{-3}$ is prepared and the buffer layers 10' having an impurity concentration of $1\times10^{18}$–$1\times10^{19}$ cm$^{-3}$ are formed on the P type semiconductor wafer with a photo mask 11 such that each buffer layer 10' is located within a corresponding chip area the p type wafer which becomes the substrate 1 of the chip. In contrast, in the related art shown in FIG. 5, the buffer layer 10 is uniformly grown on the p type semiconductor wafer 1 by epitaxial growth. Then, as shown in FIG. 2B, the n$^-$ type layer 2 which has the impurity concentration of approximately $2\times10^{14}$ cm$^{-3}$ is epitaxially grown. The base areas 3, the source areas 4, the gate insulating films 5, the gate electrode 6, the interlayer insulation film 7 and the source electrode 8, all of which are provided for the respective chip areas, are formed, and a metal film for the drain electrode 9 is formed on the back surface of the wafer 1. Concretely, in each chip area, a surface area of the n$^-$ type layer 2 is oxidized to form the gate insulating film 5, and then a polycrystalline silicon film is deposited and patterned into the gate electrode 6. Both the base areas 3 and the source areas 4 are formed by using the patterned gate electrode 6 as a double-diffusion mask. Next, the interlayer insulation film 7 is deposited, and contact holes for the respective IGBT unit cells are formed at part of both the gate insulating film 5 and the interlayer insulation film 7; then, the source electrode 8 is formed. The drain electrode 9 is formed by depositing a metal film on a back side of the semiconductor substrate 1. The locations of the base areas 3, the gate electrode 6, and so forth, all of which collectively forms a plurality of IBGT cells in each chip area, are aligned to the edge 10a of the corresponding buffer layer 10' when they are formed. Also, when the locations thereof are determined, a mask overlay accuracy is taken into consideration.

After that, as shown in FIG. 2C, at a portion where the buffer layer 10' is not disposed, the resultant semiconductor wafer is diced into the individual IGBT chips.

According to this embodiment, it is possible for the buffer layer 10' not to be bare at the chip side of the cross-section which is formed by dicing.

(Second Embodiment)

Figure 3A:
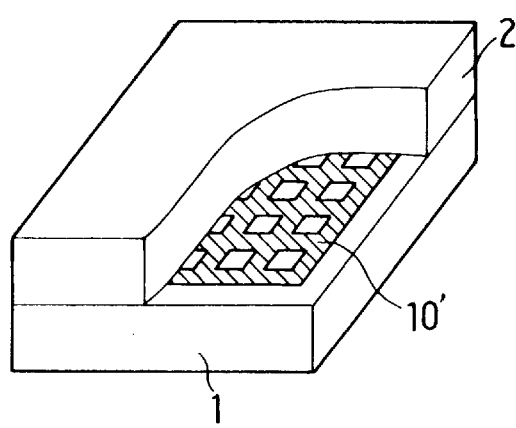
FIGS. 3A and 3B are partial section views illustrating an IGBT chip according to a second preferred embodiment of the present invention.
Figure 3B:
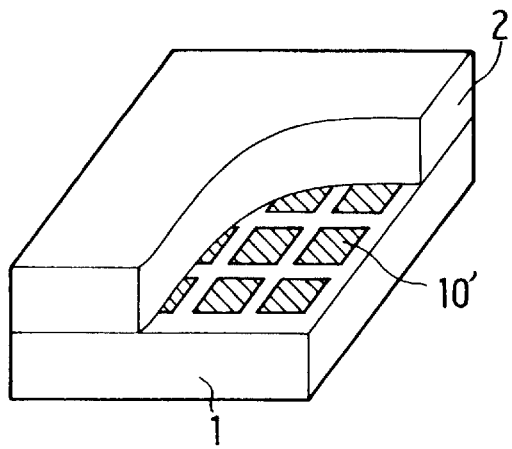

The present invention may be embodied in other specific forms without departing from the spirit or essential characteristics thereof. For instance, in the first embodiment, the buffer layer 10' is almost formed out in each chip area of wafer so as to be disposed between the semiconductor substrate 1 and the n type layer 2 except for the dicing area (i.e., a portion of the edge of the cross-section of the individual chip); however, the buffer layer 10' can be formed to be, in each chip, in a mesh shape as shown in FIG. 3A, or an island shape as shown in FIG. 3B. The mesh-shaped or island-shaped buffer layer 10' makes hole injection efficiency from substrate 1 to n$^-$ type layer high during the ON-state of the IGBT, and thereby lowering the ON-resistance.

Figure 4:
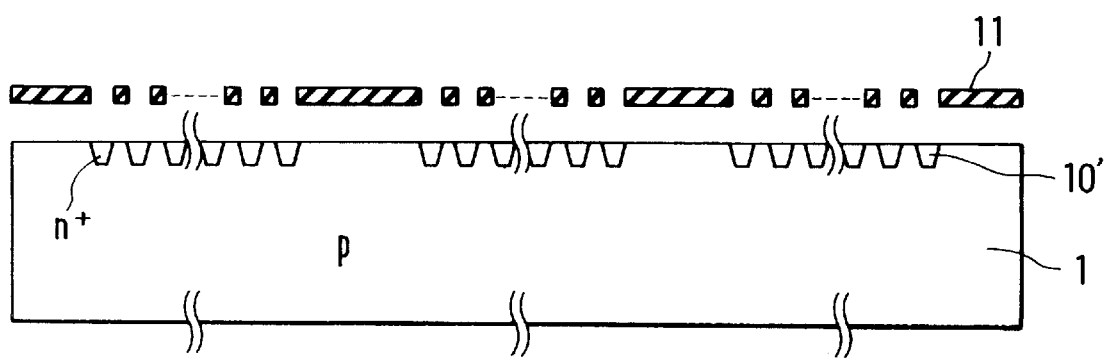
FIG. 4 is a cross-sectional view showing a process of forming a buffer layer in the IGBT illustrated in FIG. 3.

The mesh-shaped buffer layer 1' or the island-shaped buffer layer 10' is formed on the semiconductor substrate 1 by changing the pattern of the photo mask 11 used in the process of forming the buffer layer 10' to a new pattern shown in FIG. 4.

The present embodiments are therefore to be considered in all respects as illustrative and not restrictive, the scope of the invention being indicated by the appended claims rather than by the foregoing description, and all changes which come within the meaning and range of equivalency of the claims are therefore intended be embraced therein.

What is claimed is:

1. An insulated gate bipolar transistor implemented in a diced semiconductor chip, the transistor comprising:

a first layer made of a first conductivity type semiconductor;

a second layer made of a second conductivity type semiconductor and disposed over and spanning an entire area of a first surface of the first layer;

a base area made of the first conductivity type semiconductor and formed in the second layer so that a first pn junction is defined between the second layer and the base area;

a source area made of the second conductivity type semiconductor, formed in the base area so that a second pn junction defined with the base area is spaced from the first pn junction, a surface of the base area between the first and second pn junctions being used for a channel area;

an insulated gate electrode disposed at least over the channel area;

a source electrode electrically connected to the source area;

a buffer layer made of the second conductivity type semiconductor and disposed between the first and the second layers except at least at all outer edges of diced cross-sections of the chip, the buffer layer having an impurity concentration higher than that of the second layer; and a drain electrode disposed on a second surface of the first layer on an opposite side of the second layer as the first surface, so that a current flows between the drain electrode and the source electrode through the first layer and the buffer layer, wherein the first surface of the first layer contacts one of the second layer and the buffer layer to form a third pn junction extending to both edges of the diced cross-section of the chip; and wherein the third pn junction includes end portions exposed at both edges of the diced cross-section of the chip, the end portions of the third pn junction being formed by the first layer and the second layer.

2. An insulated gate bipolar transistor according to claim 1, wherein the first layer contacts the second layer at both edges of the diced cross-section of the chip to provide the end portions of the third pn junction, and first and second ends of the buffer layer are terminated respectively at a predetermined distance from the both edges of the diced cross-section of the chip.

3. An insulated gate bipolar transistor according to claim 1, wherein a distance between one of the edges of the diced cross-section of the chip and an edge of the buffer layer is provided such that the edge of layer is uninfluenced by roughness resulting from dicing.

4. An insulated gate bipolar transistor according to claim 1, wherein the buffer layer has a mesh shape in which a plurality of holes is formed in a spanning sheet thereof so that the first layer contacts to the second layer directly through the plurality of holes.

5. An insulated gate bipolar transistor according to claim 1, wherein the buffer layer is constituted by a plurality of island portions so that each island portion is isolated from the other island portions by the first and second layers.

6. An insulated gate bipolar transistor according to claim 1, wherein the buffer layer is disposed approximately parallel to the first surface of the first layer and has first and second end portions each spaced from a corresponding one of the edges of the diced cross-section of the chip.

7. An insulated gate bipolar transistor according to claim 1, wherein the second layer prevents the first layer from being exposed on a surface of the chip on an opposite side of the drain electrode.

8. An insulated gate bipolar transistor according to claim 1, wherein the first layer prevents the drain electrode from directly contacting either one of the second layer and the buffer layer.

9. An insulated gate bipolar transistor according to claim 1, wherein the third pn junction except the end portions is defined between the first layer and the buffer layer and has a withstand voltage smaller than that of the end portions.

10. An insulated gated bipolar transistor according to claim 1, wherein the third pn junction extends continuously to the both edges of the diced cross-section of the chip.

11. An insulated gate bipolar transistor according to claim 1, wherein the buffer layer is a continuous layer.

12. An insulated gate bipolar transistor according to claim 1, wherein the buffer layer underlies an entire region of the source electrode.

13. An insulated gate bipolar transistor implanted in a semiconductor chip, the transistor comprising:
    a first layer with a drain electrode, made of a first conductivity type semiconductor;
    a second layer with a cell comprising a base area, a source area, an insulated gate electrode and a source electrode, the second layer being made of a second conductivity type semiconductor and formed over and spanning an entire surface of the first layer opposite a side of the first layer facing the drain electrode, wherein a current flows between the drain electrode and the source electrode; and
    a buffer layer formed between the first layer and the second layer and having a peripheral edge portion, all of the peripheral edge portion being spaced from all outer side surfaces of the chip by at least a specific distance, the buffer layer being made of the second conductivity type semiconductor and having an impurity concentration higher than that of the second layer,
    wherein the first layer contacts one of the second layer and the buffer layer to form a pn junction extending to opposed first and second side surfaces of the chip; and
    wherein the pn junction includes first and second end portions respectively exposed on the first and second side surfaces of the chip, the first and second end portions being formed by the first layer and the second layer.

14. An insulated gate bipolar transistor according to claim 13, wherein the first layer directly contacts the second layer between one of the outer side surfaces of the chip and the peripheral edge portion of the buffer layer.

15. An insulated gate bipolar transistor according to claim 13, wherein:
    a current is supplied to the drain electrode; and
    the current flows in the first layer and the buffer layer in a direction approximately perpendicular to a surface of the chip.

16. An insulated gate bipolar transistor according to claim 13, wherein the buffer layer has a mesh shape.

17. An insulated gate bipolar transistor according to claim 13, wherein the buffer layer extends approximately in parallel to a surface of the first layer and has first and second end portions spaced, respectively, from corresponding first and second outer side surfaces of the chip.

18. An insulated gate bipolar transistor according to claim 13, wherein the first layer prevents the drain electrode from directly contacting either one of the second layer and the buffer layer.

19. An insulated gate bipolar transistor according to claim 13, wherein the pn junction except the first and second end portions is defined between the first layer and the buffer layer and has a withstand voltage smaller than that of the first and second end portions.

20. An insulated gate bipolar transistor according to claim 13, wherein each of the outer side surface does not have the buffer layer thereon.

21. An insulated gate bipolar transistor according to claim 13, wherein the pn junction extends continuously to the first and second end portions.

22. An insulated gate bipolar transistor according to claim 13, wherein the buffer layer is a continuous layer.

23. An insulated gate bipolar transistor according to claim 13, wherein the buffer layer underlies an entire region of the source electrode.

24. An insulated gate bipolar transistor implanted in a semiconductor chip, the transistor comprising:
    a first layer with a drain electrode, made of a first conductivity type semiconductor;
    a second layer with a cell comprising a base area, a source area, an insulated gate electrode and a source electrode, the second layer being made of a second conductivity type semiconductor and formed over and spanning an entire surface of the first layer opposite a side of the first layer facing the drain electrode, wherein a current flows between the drain electrode and the source electrode; and
    a buffer layer formed between the first layer and the second layer and terminated to have a peripheral edge portion, all of the peripheral edge portion being spaced from all outer diced side surfaces of the chip, the buffer layer being made of the second conductivity type semiconductor and having an impurity concentration higher than that of the second layer,
    wherein the second layer prevents the first layer from being exposed on a surface of the chip on an opposite side of the drain electrode.

25. An insulated gate bipolar transistor according to claim 24, wherein the buffer layer is a continuous layer.

26. An insulated gate bipolar transistor according to claim 24, wherein the buffer layer underlies an entire region of the source electrode.

27. An insulated gate bipolar transistor implemented in a diced semiconductor chip, the transistor comprising:

a first layer of the a first conductivity type semiconductor;

a second layer of a second conductivity type semiconductor, the second layer disposed over the first layer and forming a first pn junction with the first layer;

a MOS structure disposed at a surface portion of the second layer, comprising a base area of a first conductivity type semiconductor which forms a second pn junction with the second layer, a source area of a second conductivity type semiconductor which forms a third pn junction with the base area, and an insulated gate;

a first electrode electrically connecting with the first layer;

a second electrode electrically connecting with the base area and the source area, wherein a current flows between the first electrode and the second electrode; and a buffer layer of a second conductivity type semiconductor, disposed between the first and second layers, having an impurity concentration higher than the second layer, and forming a fourth pn junction with the first layer, said diced semiconductor chip having surrounding peripheral side edges, and the first pn junction appearing on each peripheral side edge and precluding the fourth pn junction from appearing on the each and every peripheral side edge.

28. An insulated gate bipolar transistor according to claim 27, wherein the first layer prevents the first electrode from directly contacting either one of the second layer and the buffer layer.

29. An insulated gate bipolar transistor according to claim 27, wherein the second layer precludes the first layer from being exposed on a surface of the chip at an opposite side of the first electrode.

30. An insulated gate bipolar transistor according to claim 27, wherein the fourth pn junction is terminated to be spaced from all the peripheral side edges of the diced semiconductor chip.

31. An insulated gate bipolar transistor according to claim 27, wherein the first electrode has a first electrode surface having one of the second layer and the buffer layer with the first layer interposed therebetween, the first layer directly contacting an entire area of the first electrode surface.

32. An insulated gate bipolar transistor according to claim 31, wherein the buffer layer has first and second end portions and extends in parallel with the first electrode surface between the first and second end portions each of which is spaced from the peripheral side edges.

33. An insulated gate bipolar transistor according to claim 27, wherein the buffer layer is a continuous layer.

34. An insulated gate bipolar transistor according to claim 27, wherein the buffer layer underlies an entire region of the second electrode.

* * * * *